United States Patent [19]

Hulse

[11] 4,103,063

[45] Jul. 25, 1978

[54] CERAMIC-METALLIC EUTECTIC STRUCTURAL MATERIAL

[75] Inventor: Charles Orcutt Hulse, South Glastonbury, Conn.

[73] Assignee: United Technologies Corporation, Hartford, Conn.

[21] Appl. No.: 669,432

[22] Filed: Mar. 23, 1976

[51] Int. Cl.² .................... C04B 35/76; F01D 5/78; F04D 7/06; F04D 29/02

[52] U.S. Cl. .................... 415/212 R; 106/55; 106/59; 106/62; 106/65; 106/66; 415/214; 416/241 B

[58] Field of Search .................... 106/59, 62, 65, 66, 106/55; 416/230, 241 B, 241; 415/214, 200, 212 R, 213 T; 428/294, 328

[56] References Cited

U.S. PATENT DOCUMENTS

| | | | |
|---|---|---|---|
| 2,873,947 | 2/1959 | Perry | 416/241 B |
| 3,098,723 | 7/1963 | Micks | 416/230 |
| 3,131,073 | 4/1964 | Long | 106/55 |
| 3,215,512 | 11/1965 | Coad | 416/241 B |
| 3,220,860 | 11/1965 | Robiette | 106/62 |
| 3,369,877 | 2/1968 | Humenick et al. | 106/62 |
| 3,386,918 | 6/1968 | Hough et al. | 106/65 |
| 3,564,940 | 2/1971 | Thompson et al. | 75/170 |
| 3,575,789 | 4/1971 | Siefert et al. | 428/294 |
| 3,607,608 | 9/1971 | Siefert | 106/55 |
| 3,790,303 | 2/1974 | Endres | 416/241 |
| 3,796,673 | 3/1974 | Clark et al. | 23/301 |
| 3,833,389 | 9/1974 | Komeya et al. | 106/55 |
| 3,844,727 | 10/1974 | Copley et al. | 416/230 |
| 3,862,846 | 1/1975 | Smoak et al. | 106/62 |
| 3,900,626 | 8/1975 | Brennan | 428/294 |
| 3,900,668 | 8/1975 | Olcott | 416/241 |
| 3,973,977 | 8/1976 | Wilson | 106/62 |
| 4,016,446 | 4/1977 | Cadoff | 106/65 |

*Primary Examiner*—J.C. Cannon
*Attorney, Agent, or Firm*—Charles E. Sohl

[57] ABSTRACT

A class of structural oxidation resistant ceramic base materials are described. The materials consist of an oxide matrix, which is resistant to the transport of oxygen by diffusion, and this matrix contains metallic fibers of a material which develops a stable protective oxide layer. The overall material composition is approximately eutectic so that the fiber-matrix combination can be formed by solidification directly from the melt. Directional solidification may be employed to produce a structure with oriented fibers.

6 Claims, 4 Drawing Figures

CERAMIC-METALLIC EUTECTIC STRUCTURAL MATERIAL

The invention herein described was made in the course of or under a contract or subcontract thereunder, with the Department of the Navy.

BACKGROUND OF THE INVENTION

1. Field of the Invention

This invention relates to the field of ceramic base structural materials which are useful at temperatures approaching 2700° F.

2. Description of the Prior Art

As shown in the patent to Kraft U.S. Pat. No. 3,124,452, it is now known that various eutectic compositions may, by directional solidification techniques, be cast into bodies displaying unique ordered microstructures and properties. With the metallic eutectics or eutectic-type allows a number of particularly useful systems have been developed to take advantage of the ordered eutectic alloy microstructures in gas turbine engine hardware, including the aligned nickel-base alloys described in the patent to Thompson U.S. Pat. No. 3,554,817 and the aligned cobalt-base alloys of monovariant eutectic composition of Thompson et al U.S. Pat. No. 3,564,940. Also of substantial utility are the skeletal or cellular microstructures mentioned in Lemkey et al U.S. Pat. No. 3,552,953.

The metallic alloys are, however, typically limited in terms of their practical operating temperatures. To satisfy the increasing demand for gas turbine engine materials which will be strong at very high temperatures, attention has quite naturally been given to ceramics which, from the standpoint of their high temperature capabilities, easily surpass most metallic materials. However, the moderate temperature capabilities of the bulk of the ceramics are generally so low that they are not usable in many important applications for which they might otherwise be well suited although some strides have been made leading to property improvements sufficient for use in some applications as discussed, for example, in the patent to Marshall et al U.S. Pat. No. 3,181,939.

U.S. Pat. No. 3,761,295 depicts a ceramic-ceramic eutectic system which possesses useful properties when directionally solidified. A group of ceramic-metallic eutectic systems are described in U.S. Pat. No. 3,796,673, and appear to have application for certain electronic applications.

SUMMARY OF THE INVENTION

The present invention relates to a structural eutectic material composed of a ceramic matrix which is essentially impervious to oxygen containing a fine fibrous reinforcing phase. This material has a unique combination of oxidation resistance and mechanical properties at elevated temperatures and is potentially useful in gas turbine applications.

The foregoing, and other objects, features and advantages of the present invention will become more apparent in the light of the following detailed description of the preferred embodiment thereof as shown in the accompanying drawing.

DESCRIPTION OF THE PREFERRED EMBODIMENTS

Figure 1:
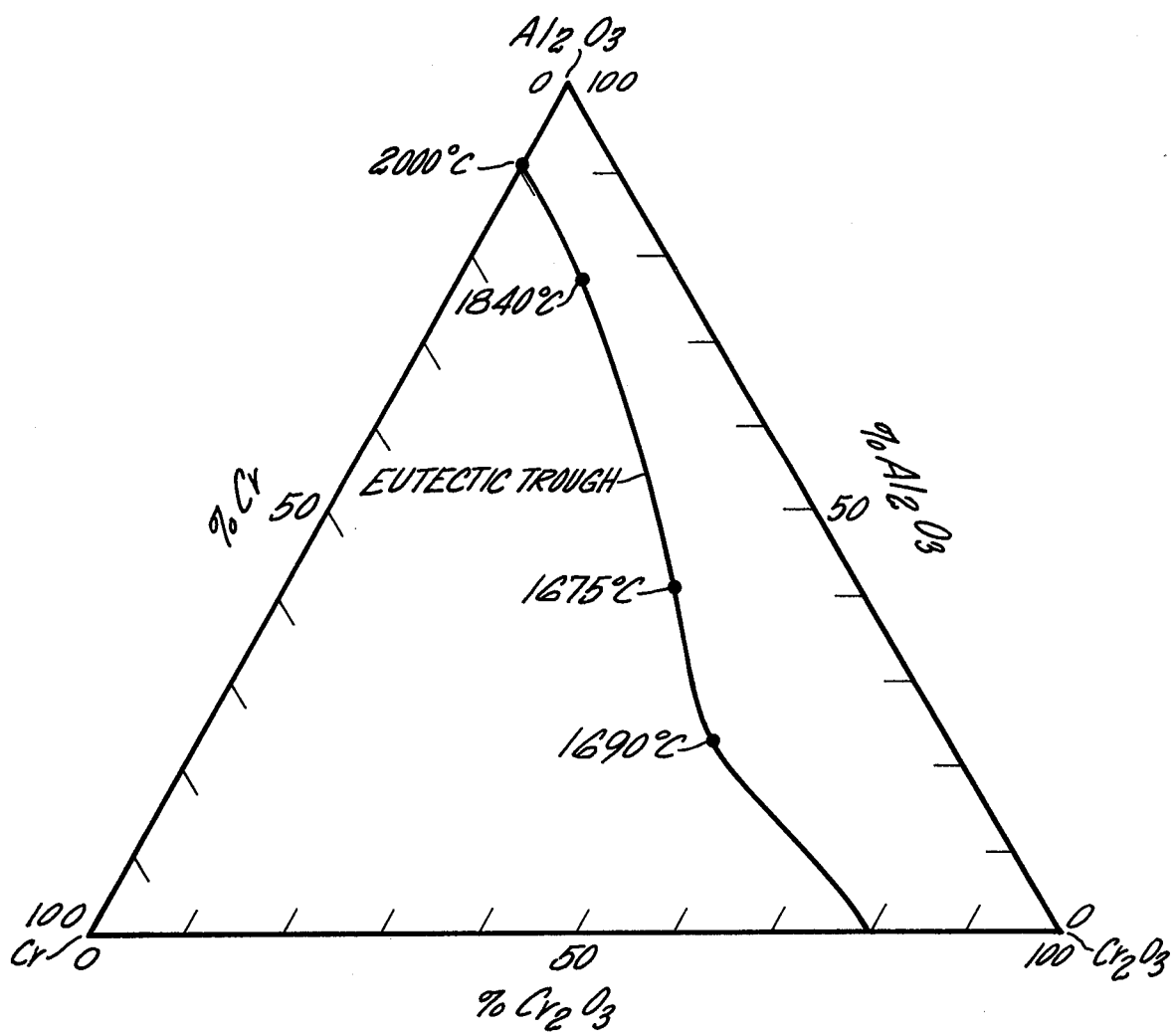
FIG. 1 shows the liquidus section of the $Cr-Cr_2O_3-Al_2O_3$ ternary phase diagram.

The present invention relates to a ceramic based composite material, suitable for structural use, which possesses long term stability and resistance to oxidation at elevated temperatures, for example, as high as about 2700° F. A particular feature of the material is its enhanced thermal and mechanical shock resistance at moderate temperatures as a result of the incorporation of fine, stable fibrous metal phase. The material is of eutectic composition with at least one phase of the eutectic, the matrix phase, being an oxide base ceramic and at least one further phase of the eutectic being a fibrous metallic phase. Eutectics are compositions which freeze congruently at a temperature which is depressed from the freezing temperature of the pure phases which make up the eutectic. Upon freezing a eutectic produces at least two phases in a fixed ratio which is governed by the eutectic composition. Because eutectic phases freeze congruently and for other thermodynamic reasons, eutectic structures have extreme thermal stability and a eutectic structure will be found to be essentially free from any propensity towards any changes in the morphology of the various phases which were formed during solidification. A particularly interesting and useful process which may be employed in the solidification of eutectics is termed directional solidification and this process is described in several patents which are assigned to the present assignee, for example U.S. Pat. Nos. 3,124,452 and 3,761,295, the contents of which are incorporated herein by reference. In directional solidification the phases form in an oriented fashion and are generally elongated. The resultant properties are anisotropic as a result of this elongation. The microstructure of the second phase may be fibers, rods or plates and in this application the term fibrous will be used to encompass all of these possible forms. During the directional solidification process the relative orientation of the second phase may be closely controlled and the particular orientation in which the optimum mechanical properties are observed generally corresponds to the direction of elongation of the second phase. Although directional solidification may be employed in conjunction with the materials of the present invention, nondirectional solidification, which will produce randomly oriented fibers, may be useful for many applications.

The particular class of materials with which the present invention deals is the class of eutectics between oxide ceramics and metals. Basically the oxide ceramic is used as the matrix and has characteristic properties which include good elevated temperature strength and some ductility combined with poor ductility and low toughness at lower temperatures.

This ceramic matrix is reinforced with metal fibers whose diameter is on the order of microns, for example from about 1 to about 10 microns. The average length to diameter ratio of these fibers is preferably at least about 10:1. The characteristics of metallic materials include good toughness and ductility over a wide temperature range. These fibers, which may be oriented by directional solidification, reinforce the material, particularly at the lower temperatures, and serve to minimize crack initiation and propagation. Thus the structural composite material of the invention combines the benefits and advantageous elevated temperature properties of the ceramic matrix with the low and intermediate temperature benefits of the ductile reinforcing metallic phase. In addition, the fineness and regularity of the directionally solidified microstructure contributes to a general improvement in mechanical properties, particularly at elevated temperatures. However, these features alone are not sufficient to produce a practical structural material suited for long term use in adverse atmospheres such as are found in gas turbine engines. In such applications resistance to environmental degradation may well be the limiting property in terms of design and performance. The present materials are selected so as to have extreme oxidation resistance even when their integrity is impaired as for example by minor surface cracking and may be used without the need for specialized coatings.

Within the limitation previously enumerated, that the system be of eutectic composition between an oxide ceramic and a metal, a further limitation must be imposed for satisfactory resistance to environmental degradation. This limitation relates to the diffusivity of oxygen through the ceramic material at elevated temperatures. It has been found that in order to provide satisfactory resistance to internal oxidation of the reinforcing second phase by oxygen which had diffused through the matrix, the matrix must have an oxygen diffusivity which is less than about $10^{-10}$ cm$^2$/sec at 1400° C. This value of diffusivity will insure long term stability of the reinforcing phase. Examples of suitable matrix materials are given in Table I. While all the materials given in Table I should fulfill the criteria set above with regard to oxygen diffusivity, several of these materials are preferred inasmuch as their mechanical properties and oxygen diffusivity at elevated temperatures are particularly desirable.

TABLE I

| $Al_2O_3$ | $Fe_3O_4$ |
|---|---|
| $Cr_2O_3$ | $FeCr_2O_4$ |
| $Al_2O_3 + Cr_2O_3$* | $FeAl_2O_4$ |
| $MgO . Cr_2O_3$** | $CoO . Al_2O_3$** |
| $Fe_2O_3$ | |

*solid solution
**Spinel

These preferred matrix materials include $Fe_3O_4$, $FeCr_2O_4$, $FeAl_2O_4$, $Al_2O_3$, $Cr_2O_3$ and mixtures of $Al_2O_3$ and $Cr_2O_3$ ranging from negligible $Al_2O_3$ up to essentially 100% $Al_2O_3$.

The matrix may further contain other ceramic phases, even if these phases do not satisfy the previously discussed oxygen diffusivity values, so long as the low oxygen diffusivity material is present in amounts of at least 50% by volume and is continuous and so long as the added phases which have high oxygen diffusivity values do not contact the metallic phase.

In the case of solidification of ternary eutectics, in which two phases form in a matrix, it will be found that each particle of each of the second phases is surrounded by the matrix phase. Thus even though one of the second phases has a low value of oxygen diffusivity, the metallic phase will still be protected against oxidation by the surrounding matrix. For example in a eutectic structure of Cr fibers in a $Cr_2O_3 + Al_2O_3$ ceramic matrix, a significant amount of $ZrO_2$ in fibrous form, may be incorporated in the matrix without adverse affect, even though the oxygen diffusivity of $ZrO_2$ is much greater than $10^{-10}$ cm$^2$/sec. In this case, sufficient protection for the Cr fibers is provided by the continuous $Cr_2O_3 + Al_2O_3$ matrix phase. The addition of extra phases in the matrix may produce a desirable general refinement of structure and may retard structural coarsening at elevated temperatures.

The reinforcing fibrous second phase is a metallic material which possesses relatively high toughness at moderate temperatures where the ceramic matrix phase is brittle. For practical applications in adverse atmospheres such as those found in gas turbine engines the fiber materials must have the additional property of forming a stable, adherent protective oxide. The formation of this protective oxide will then inhibit further oxidation of the fibers. It is commonly observed that the volume of oxide formed by oxidation of a metal is greater than the volume of the metal which went to form the oxide. This behavior is desirable for the purpose of the present invention since where the fibers are exposed to the corrosive atmosphere, the oxide which forms will completely fill the void in the matrix and will place the surrounding matrix in a compressive state. The fiber materials are selected from the group consisting of chrome, iron, solid solutions of chrome and iron over the complete range from 0% to 100% chrome, the compound $Ta_2Cr$, and titanium. The chrome, iron, or chrome-iron solid solution fibers are preferred for use with the previously mentioned preferred matrix materials. The metallic fibrous phase may be alloyed by the addition of amounts of metallic materials up to about 10% of the reinforcing second phase so long as no new crystal structures result and so long as the oxidation performance of the second phase material is not unduly harmed.

Although the primary application for the present materials is envisioned to be gas turbine parts such as air foils (blades and vanes) which are preferably directionally solidified, other applications may also be discovered. The most important of these applications may be in the production of improved ceramic cutting tools for machining metal components.

The present invention will be better understood after reference to the following illustrative examples.

EXAMPLE I

The liquidus section of the ternary $Cr-Cr_2O_3-Al_2O_3$ diagram is shown in FIG. 1. A mixture of 23 w/o Cr, 54.4 w.o $Cr_2O_3$, and 22.6 w/o $Al_2O_3$, having a melting point of about 3100° F, was melted in a tungsten crucible and directionally solidified by slowly withdrawing the crucible from the furnace hot zone to produce the oriented structure of the present invention. The matrix phase consisted of a solid solution of $Cr_2O_3$ and $Al_2O_3$ having an oxygen diffusivity value at 1400° C of less than about $10^{-10}$ cm/sec. The metallic reinforcing phase consisted of oriented Cr fibers which had a diameter on the order of 2 microns and a length to diameter ratio generally in excess of 10. Cr forms an adherent protective oxide, $Cr_2O_3$ which limits oxidation of the exposed fibers to a depth of a few mils at most.

Figure 2:
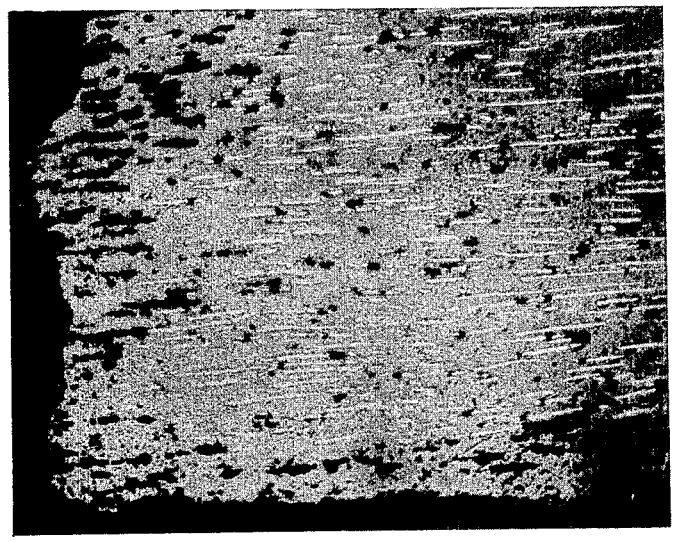
FIG. 2 shows a photomicrograph of a directionally solidified $Cr-Al_2O_3 + Cr_2O_3$ article after exposure at 2600° F for 60 hours.

A sample of this material was exposed to air at a temperature of 2600° F for 60 hours. A 500 × longitudinal photomicrograph of a sample showing the resultant oxidation is shown as FIG. 2. The elongated light phase is the Cr, and it can be seen that the maximum depth of attack was only about 0.002 in.

EXAMPLE II

Figure 3:
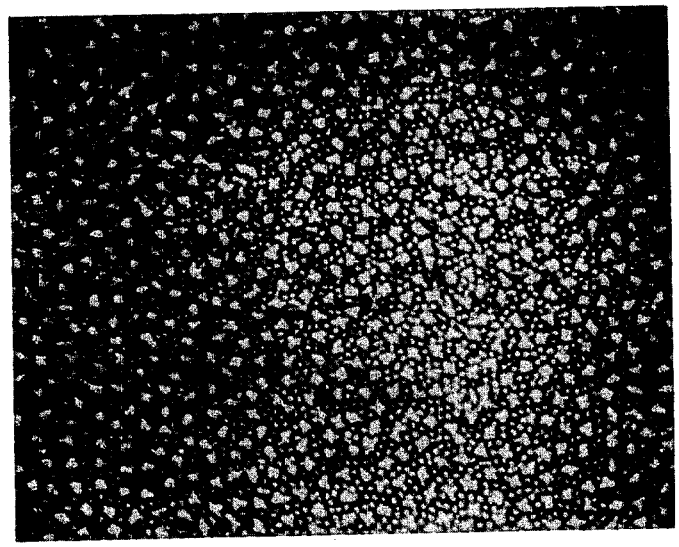
FIG. 3 shows a photomicrograph of a directionally solidified $Cr-Al_2O_3 + Cr_2O_3-ZrO_2$ article.
Figure 4:
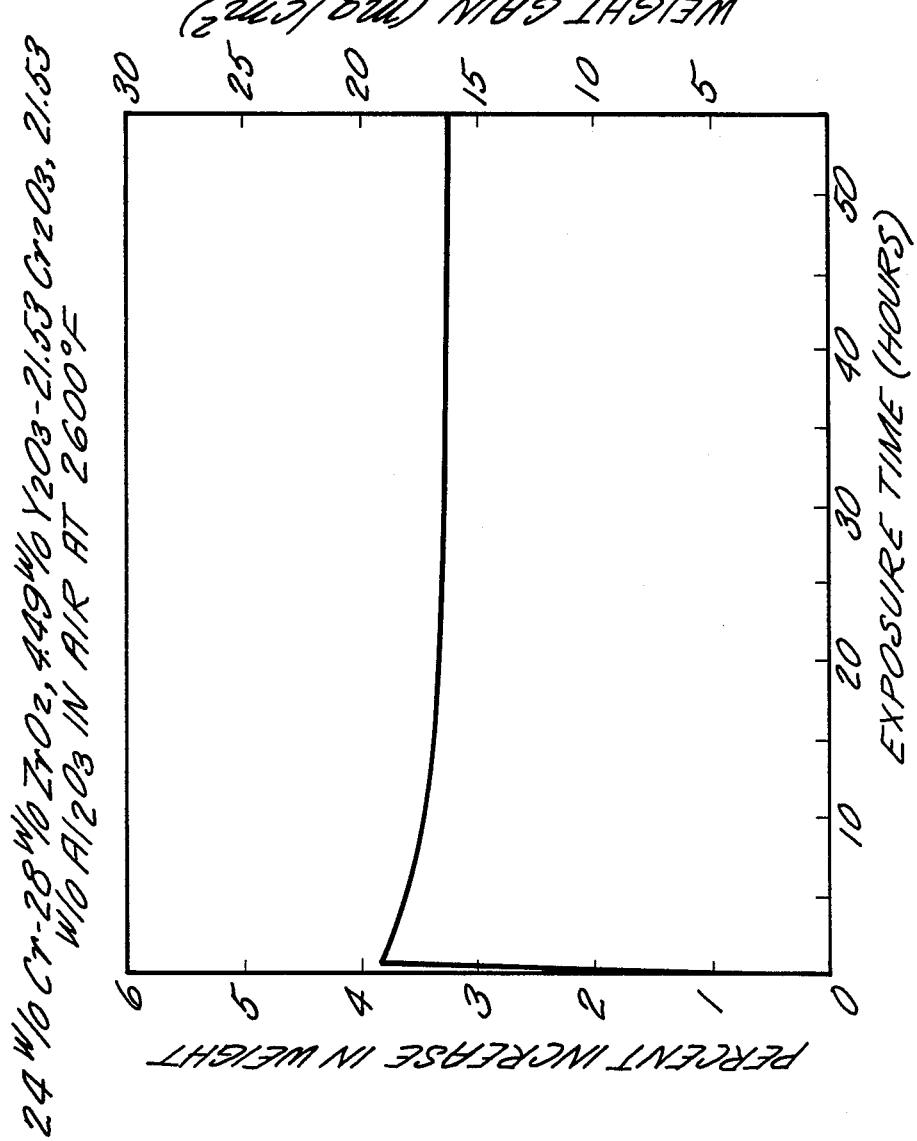
FIG. 4 shows a graph of weight change as a function of time at 2600° F for a $Cr-Al_2O_3 + Cr_2O_3-ZrO_2$ system.

A mixture of 24 w/o Cr, 21.5 w/o $Cr_2O_3$, 21.5 w/o $Al_2O_3$, 28 w/o $ZrO_2$, and 4.5 w/o $Y_2O_3$ was melted (mp=3100° F) in a tungsten crucible and directionally solidified. The resultant structure comprised a continuous $Al_2O_3 + Cr_2O_3$ solid solution matrix phase containing $ZrO_2 + Y_2O_3$ fibers and Cr fibers. A transverse S.E.M. photomicrograph of this structure is shown in FIG. 3. The larger irregularly shaped fibers are the chrome phase, the smaller particles are the $ZrO_2$ phase and the darker surrounding phase is the matrix. In this case, the continuous matrix phase ($Al_2O_3 + Cr_2O_3$) is satisfactorily resistant to oxygen diffusion, even though the noncontinuous $ZrO_2$ is not, and adequate protection is afforded the Cr fibers. FIG. 4 shows a plot of weight gain as a function of exposure time in air at 2600° F for this material. It is noteworthy that essentially all of the weight gain occurs within the first hour and that the alloy is then rather stable.

Although the invention has been shown and described with respect to a preferred embodiment thereof, it should be understood by those skilled in the art that various changes and omissions in the form and detail thereof may be made therein without departing from the spirit and the scope of the invention.

Having thus described a typical embodiment of my invention, that which I claim as new and desire to secure by Letters Patent of the United States is:

1. A directionally solidified gas turbine airfoil having
    a. an oxide ceramic matrix having an oxygen diffusivity of less than about $10^{-10}$ cm$^2$/sec at 1400° C,
    b. a fibrous reinforcing second phase having a diameter of from about 1 to about 10 microns and a length to diameter ratio of greater than about 10, with said fibrous phase having the characteristic of forming a stable protective oxide layer upon exposure to oxygen containing atmospheres at elevated temperatures, with the overall composition of the total system being that of eutectic.

2. An oxidation resistant structural ceramic composite material suited for use at elevated temperatures which comprises
    a. an oxide ceramic matrix having an oxygen diffusivity of less than about $10^{-10}$ cm$^2$/sec at 1400° C,
    b. a metallic fibrous reinforcing second phase having a diameter of from about 1 to about 10 microns and a length to diameter ratio of greater than about 10, with said fibrous phase having the characteristic of forming a stable protective oxide layer upon exposure to oxygen containing atmospheres at elevated temperatures,
  with overall composition of the total system being that of a eutectic.

3. A composite as in claim 2 wherein the fibrous second phase is oriented.

4. A composite as in claim 2 wherein the matrix is selected from the group consisting of $Al_2O_3$, $Cr_2O_3$ $Fe_2O_3$, $Fe_3O_4$, $MgO.Cr_2O_3$, $MgO.Al_2O_3$, $CoO.Al_2O_3$, mixtures of $Al_2O_3$ and $Cr_2O_3$, $FeCr_2O_4$ and $FeAl_2O_4$.

5. An oxidation resistant structural ceramic composite material suited for use at elevated temperature which comprises:
    a. an oxide ceramic matrix having an oxygen diffusivity of less than about $10^{-10}$ cm$^2$/sec at 1400° C;
    b. a fibrous reinforcing second phase having a diameter of about 1 to about 10 microns and a length to diameter ratio of greater than about 10, said second phase being selected from the group consisting of Cr, Ni, mixtures of Cr and Ni, and $Ta_2Cr$, and having the characteristic of forming a stable protective oxide layer upon exposure to oxygen containing atmospheres at elevated temperatures, with the total system composition being substantially a eutectic.

6. A composite as in claim 5 wherein the matrix material is selected from the group consisting of $Fe_3O_4$, $FeCr_2O_4$, $FeAl_2O_4$, $Al_2O_3$, $Cr_2O_3$, and mixtures of $Al_2O_3$ and $Cr_2O_3$.

* * * * *